(12) United States Patent
Weihs et al.

(10) Patent No.: US 6,380,627 B1
(45) Date of Patent: *Apr. 30, 2002

(54) LOW RESISTANCE BARRIER LAYER FOR ISOLATING, ADHERING, AND PASSIVATING COPPER METAL IN SEMICONDUCTOR FABRICATION

(75) Inventors: Timothy P. Weihs, Baltimore, MD (US); Troy W. Barbee, Jr., Palto Alto, CA (US)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,585

(22) Filed: Jun. 26, 1998

(51) Int. Cl.[7] .................. H01L 23/48; H01L 25/52; H01L 29/40
(52) U.S. Cl. ........................... 257/762; 257/751
(58) Field of Search ................. 257/750, 751, 257/753, 734, 761, 762, 763, 764, 766, 767, 771, 768

(56) References Cited

U.S. PATENT DOCUMENTS

| | | | | |
|---|---|---|---|---|
| 4,350,743 A | * | 9/1982 | Lazzari | 428/622 |
| 4,695,348 A | * | 9/1987 | Battey et al. | 216/20 |
| 4,910,169 A | * | 3/1990 | Hoshino | 438/660 |
| 4,985,750 A | * | 1/1991 | Hoshino | 257/751 |
| 5,345,108 A | * | 9/1994 | Kikkawa | 257/751 |
| 5,409,862 A | * | 4/1995 | Wada et al. | 438/607 |
| 5,518,805 A | * | 5/1996 | Ho et al. | 428/213 |
| 5,627,102 A | * | 5/1997 | Shinriki et al. | 438/648 |
| 5,641,994 A | * | 6/1997 | Bollinger et al. | 257/771 |
| 5,661,345 A | | 8/1997 | Wada et al. | 257/767 |
| 5,973,400 A | * | 10/1999 | Murakami et al. | 257/751 |

FOREIGN PATENT DOCUMENTS

JP        10098011        1/1991

OTHER PUBLICATIONS

Imahori J. et al.: "Diffusion barrier properties of TaC between Si and Cu" Thin Solid Films, vol. 301, No. 1–2, Jun. 1, 1997, pp. 142–148.

* cited by examiner

Primary Examiner—Steven Loke
Assistant Examiner—Shouxiang Hu
(74) Attorney, Agent, or Firm—L. E. Carnahan; Alan H. Thompson

(57) ABSTRACT

Cubic or metastable cubic refractory metal carbides act as barrier layers to isolate, adhere, and passivate copper in semiconductor fabrication. One or more barrier layers of the metal carbide are deposited in conjunction with copper metallizations to form a multilayer characterized by a cubic crystal structure with a strong (100) texture. Suitable barrier layer materials include refractory transition metal carbides such as vanadium carbide (VC), niobium carbide (NbC), tantalum carbide (TaC), chromium carbide ($Cr_3C_2$), tungsten carbide (WC), and molybdenum carbide (MoC).

11 Claims, 1 Drawing Sheet

LOW RESISTANCE BARRIER LAYER FOR ISOLATING, ADHERING, AND PASSIVATING COPPER METAL IN SEMICONDUCTOR FABRICATION

The United States Government has rights in this invention pursuant to Contract No. W-7405-ENG-48 between the United States Department of Energy and the Regents of the University of California for the operation of Lawrence Livermore National Laboratory.

BACKGROUND OF THE INVENTION

1. Field of the Invention

The present invention relates to semiconductor device fabrication and more particularly, to low resistance barrier layers for reliably isolating, adhering, and passivating copper metal and achieving the optimum cubic crystalline texture in the copper metal.

2. Description of Related Art

Advances in materials technology are playing an important role in improving semiconductor device performance and the reduction of power consumption in solid state electronic components and systems. Conventional semiconductor technologies, e.g., 0.50 $\mu$m CMOS, typically use multilevel aluminum alloy metallizations and chemical-vapor-deposited (CVD) tungsten plugs. The tungsten plug process is being replaced by the use of aluminum plugs in the device interconnect contacts and via holes.

Aluminum plugs reduce process complexity, increase manufacturing yield, and decrease interconnect resistance. Although the overall interconnect resistance is being reduced, the power losses in on-chip interconnect structures remains significant in integrated circuits, particularly as device density increases. To reduce such power losses further, the metallization structures need to be made with materials that have resistivities lower than aluminum and other related new materials technologies such as low-k interlevel dielectrics.

Because of its lower bulk and skin resistance, an effective replacement for aluminum is copper that is isolated from the electrically active devices by a reliable barrier material. Methods to deposit copper metallizations include electroless deposition, metal organic chemical vapor deposition (MOCVD), electroplating, and collimated physical vapor deposition (c-PVD). Regardless of the way copper is deposited, the metal must be isolated or encapsulated so that it will not diffuse into the surrounding areas of the device and thus degrade performance.

Copper appears to be the best of the available choices from the list of known low resistivity metals, e.g., silver, aluminum, gold, copper, and tungsten. Copper offers many advantages: low resistivity, ease of deposition, high thermal conductivity, a lower temperature coefficient of resistance than aluminum and tungsten, a lower coefficient of thermal expansion than aluminum, the highest melting point except for tungsten, and the lowest adiabatic temperature rise due to Joule heating. Copper is also expected to offer lower electromigration (by several orders of magnitude) in poly or single crystalline materials. The copper texture also enhances performance, yielding lower stresses and other beneficial properties.

The shrinking feature sizes of ULSI circuits places severe requirements on interconnect metallization technologies, particularly where severe topography exists, such as in submicron diameter contact windows and vias. Since sub- 0.25 $\mu$m feature size integrated circuits will be performance limited by the resistance in the metal interconnects, copper metallization is better than aluminum because of copper's lower resistivity and higher resistance to electromigration.

Given these advantages, semiconductor manufacturers are expending significant efforts to incorporate copper into upper-level metallizations. The use of copper, however, also requires the incorporation of diffusion barriers, adhesion promoters, and passivation layers. Diffusion barriers that are thermally stable, chemically stable, and electrically conductive are needed to isolate copper due to its high atomic mobility. Copper diffuses rapidly in silicon and dielectrics, which strongly degrades semiconductor device performance, and thus materials must be identified that block this diffusion.

Adhesion promoters are needed since copper does not "wet" or bond well to silicon dioxide and other dielectric surfaces, especially when subjected to thermal cycling. Passivation layers are required to prevent environmental degradation of the etched or chemically/mechanically polished copper surfaces. Substantial efforts have been made to identify barrier layer materials that meet all major requirements, e.g., diffusion barrier, adhesion promoter, passivation barrier, and low electrical resistivity for a low contact/via resistance.

Tantalum, TiN, TiCON, and TiOS have been used for barrier layer materials. Other conventional barrier technologies include amorphous refractory alloys. These diffusion barrier materials have been shown to be effective at very high temperatures. While all of these materials can inhibit the movement of copper, none of them optimize the microstructure of the copper as it is deposited. Thus, the potential for significant enhancements in the performance of the metallization are lost. Barrier materials that produce copper with a very uniform microstructure that includes a strong (100) cubic texture and a large grain size are desirable.

It is the object of the present invention to address the problems inherent in the conventional barrier systems and provide a low resistance barrier material that effectively isolates, adheres to, and passivates copper metal for semiconductor fabrication.

SUMMARY OF THE INVENTION

The present invention is a low resistivity refractory metal carbide barrier system that reliably isolates, adheres, and passivates copper surfaces in semiconductor fabrication. This copper metallization barrier layer controls and optimizes the texture and grain size (i.e., microstructure) of copper metallizations and thereby maximizes the performance and reliability of the metallization and overall semiconductor device. Suitable metal carbide barrier layer materials include carbides of transition metals, such as chromium carbide ($Cr_3C_2$), vanadium carbide (VC), niobium carbide (NbC), tantalum carbide (TaC), tungsten carbide (WC), and molybdenum carbide (MoC). These materials have either a cubic (NaCl) structure at equilibrium (e.g., VC, NbC, TaC) or a metastable cubic structure (e.g., $Cr_3C_2$, MoC, WC) that is formed under non-equilibrium conditions.

These metal carbides are insoluble or have limited solubility in copper in the solid and liquid states (depending on the specific carbide) and are effective diffusion barriers, i.e., these carbides can block copper diffusion and isolate copper metallizations from the rest of an integrated circuit device. Furthermore, these metal carbides are wetted by copper, which is critical to providing excellent adhesion between copper and materials such as silicon or conventional dielectrics.

One embodiment of the present invention is a multilayer film of metal carbide barrier layers and copper layers, where the metal carbide layers afford microstructural control of the copper layers. For example, one or more barrier layers of chrome carbide ($Cr_3C_2$) are deposited on the substrate (e.g., silicon, silicon dioxide) in conjunction with copper metallizations. The thickness of the carbide layers may be as thin as 200 Å or less. The final, terminating layer of copper of the $Cu/Cr_3C_2$ multilayer may be, and typically is, thicker than the underlying copper layers. The copper and the carbide barrier materials can be deposited by a variety of processes, such as MOCVD, electroless deposition, collimated physical vapor deposition (c-PVD), magnetron sputtering, and electroplating.

The present invention provides a robust, production-worthy, integrated deposition technology for low power, high performance, high reliability copper metallizations with critical dimensions of 0.25 μm and less. The cubic barrier layer or layers enhance and maintain the (100) crystallographic texture and orientation of the copper metallizations, as well as increase strength, passivation, and thermal stability. The barrier layer also isolates the copper from contamination associated with subsequent processing. Other objects and advantages of the present invention will become apparent from the following description and accompanying drawing.

BRIEF DESCRIPTION OF THE DRAWINGS

The accompanying drawing, which is incorporated into and forms part of this disclosure, illustrates an embodiment of the invention and together with the description, serves to explain the principles of the invention.

DETAILED DESCRIPTION OF THE INVENTION

The present invention is a barrier layer system for copper metallizations that comprises a refractory metal carbide. The metal carbide has either a cubic (NaCl) structure at equilibrium or a metastable cubic structure. Suitable metal carbides include transition metal carbides such as chromium carbide ($Cr_3C_2$), vanadium carbide (VC), niobium carbide (NbC), tantalum carbide (TaC), tungsten carbide (WC), and molybdenum carbide (MoC). The barrier layer system may comprise a single metal carbide layer, or the barrier layers may be deposited alternately with copper layers to form a multilayer. The carbide and copper may be deposited using conventional processes.

The cubic metal carbide layer promotes a face centered cubic (100) texture and orientation in the growth of the copper during its deposition. The carbide barrier layers, particularly in a carbide-copper multilayer, maintain and enhance the (100) crystallographic texture of the copper, thereby increasing the strength, thermal stability, and passivation of the copper metallizations. Furthermore, the barrier layers isolate the majority of the copper from contamination that can occur during subsequent processing steps. The metal carbides are immiscible or have limited solubility (depending on the carbide) in copper in both the solid and liquid states and are effective diffusion barriers. Copper wets (or bonds to) these carbides, which provides excellent adhesion between copper and silicon or standard dielectric materials.

The combination of copper and a suitable cubic carbide (e.g., $Cr_3C_2$, VC, TaC, WC, MoC, NbC) is advantageous because of copper's low resistivity, the ability of the metal carbide to wet copper, and the insolubility of copper in the carbides, so no mixing or diffusion occurs between the copper and carbide layers. The metal carbides are stable in thin layers next to copper and have low resistivity. Thus, cubic metal carbides serve as good diffusion barrier materials for copper interconnect structures on integrated circuits.

In addition, these cubic metal carbides are effective barrier layer materials for copper metallizations because they produce very strong cubic textured structure (epitaxy) in the copper that is deposited on the barrier layer. A cubic or textured microstructure yields a better copper metallization because smaller thermal stresses are generated as temperature varies. In particular, cubic or (100) textured copper on silicon has a smaller value of Δ (thermal stress)/Δ (temperature) than (111) aluminum on silicon. This lower stress has a significant impact on the amplitude of the thermal stresses that arise during use and high temperature processing steps, which enhances the stability of the microstructure and the performance and reliability of the copper metallizations.

Figure 1A:
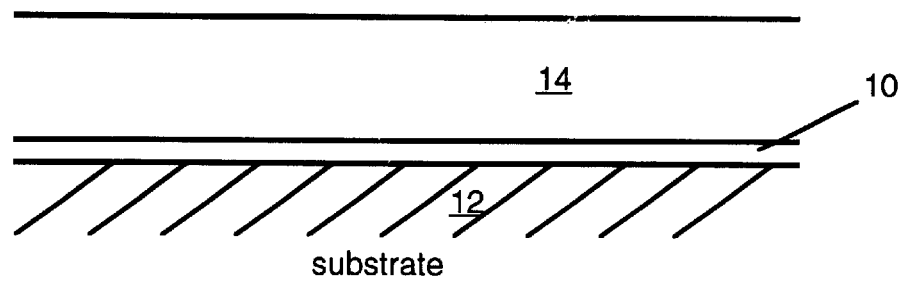
FIG. 1A shows schematically a metal carbide layer at the substrate acting as a barrier layer for copper metallizations.
Figure 1B:
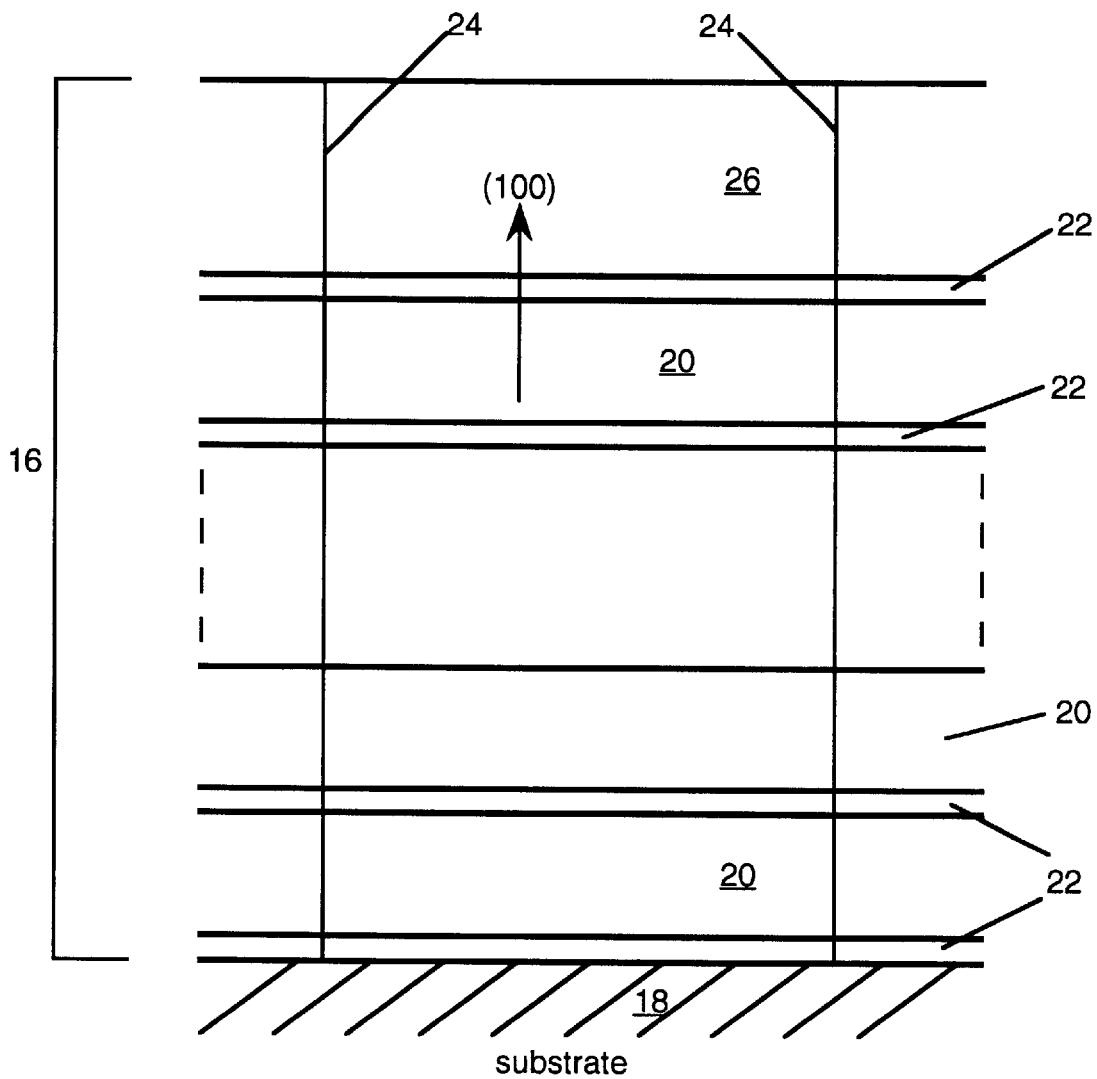
FIG. 1B shows schematically a copper/metal carbide multilayer in which the carbide at the substrate acts as a barrier layer for copper metallizations.

FIGS. 1A and 1B show embodiments (not to scale) of barrier layers for copper metallizations. FIG. 1A shows a simple system, where a single layer 10 of a cubic textured metal carbide is deposited on a substrate 12. A layer 14 of copper, also having cubic texture, is deposited on the barrier layer 10. FIG. 1B shows a more complex system, where a Cu/metal carbide multilayer film 16 is deposited on a silicon substrate 18. One example of a multilayer film 16 is approximately 75 μm in total thickness, where the individual copper layers 20 are 270 Å thick and the carbide layers 22 are 16 Å thick. Cross-sectional TEM micrographs of the multilayers show that the films grow with a large columnar grain boundaries 24 having in-plane copper grain sizes (~0.5 μm) that exceed the copper layer thickness by a factor of 20. The topmost copper layer 26 may be the same thickness as (or thinner than) the underlying copper layers 20, but typically the top layer 26 is a thicker metallization line, as illustrated in FIG. 1B.

With very sharp cubic texture, (100) planes of each grain are not only aligned parallel to the deposition plane, but their orientation within the plane of deposition is also partially aligned from grain to grain. Such crystallographic texturing and microstructure reduce the thermal stress effects in copper lines, e.g., along the length of the interconnect lines. Such stress reduction minimizes the chance of void formation and sidewall failure during operation, and enhances the stability of the as-deposited microstructure during subsequent processing steps. The reduction in thermal stresses, the increased stability of the microstructure, and the large grain size provided by this invention will result in significant improvements in the performance and the reliability of copper metallizations.

The ability of copper to grow abnormally wide grains on the carbide is attributed, in part, to copper's ability to wet the carbide. This characteristic can also be seen in TEM micrographs, which show smooth, semi-coherent interfaces between the two sputter deposited materials. The layers are nearly atomically flat and uniform. There may be slight lattice mismatch between the copper and the metal carbide; copper and $Cr_3C_2$, for example, have a mismatch of approximately 4%, creating periodic edge dislocations at the $Cu/Cr_3C_2$ interface. TEM micrographs show the texturing of the materials: $Cr_3C_2$ is crystalline in its first layering on copper, and copper adopts a cube texture within its first few layers.

Multilayer films of copper/metal carbide, such as $Cu/Cr_3C_2$, have been characterized using x-ray diffraction (XRD), transmission electron microscopy (TEM), differential scanning calorimetry (DSC), and resistivity measurements. The multilayer films are strong and highly conductive. Various $Cu/Cr_3C_2$ multilayer films having different thicknesses were deposited by magnetron sputtering from targets of copper and $Cr_3C_2$ at powers ranging from 100–500 W. The distance from source to substrate varied from 3.9 inches to 5.3 inches.

Calorimetry measurements have shown that $Cr_3C_2$ layers as thin as 16 Å are stable in copper up to 650° C., and thus thicker barrier layers should be stable to even higher temperatures. When a multilayer film such as shown in FIG. 1 is heated to 725° C. (at 100° C./min or 20° C./min), the 16 Å $Cr_3C_2$ layers decompose to form small, oval shaped particles that are uniformly distributed within the original layers in the film. This decomposition of the layers reduces the total interfacial energy of the system. After the particles form, they coarsen with time but no additional exothermic heat is observed on a second scan of the film to 725° C. Thus, the cubic texture of the copper remains stable, i.e., the copper layers have very strong cubic texture both before and after heating, even though the $Cr_3C_2$ layers coarsen into particles. In all TEM analyses, no interface reaction or interdiffusion was observed.

The chemical wetting of the metal carbide by copper and the lattice matching between copper and the carbide produce strong adhesion and very uniform interfaces between the two materials. Both factors are important in generating the very strong cubic texture (both normal to and in the plane of the layers) that is observed. Because of the intensity of the texturing, this layered composite can be described as a mosaic single crystal.

To investigate the initiation of texturing, a series of depositions were performed to see what combination of copper and barrier layer thicknesses produced the most cubic texture in the multilayer films. The degree of (100) cubic texture is estimated by comparing the intensities of the (111) and (100) peaks. The ratio $I_{(111)}/I_{(100)}$ is cited for symmetric XRD scans. For a random copper film, $I_{(111)}/I_{(100)}$ is 2/1. Values below this ratio suggest cubic (100) texture, and values above this ratio suggest (111) texture.

For example, a multilayer of over 2100 layers of $Cu/Cr_3C_2$ (270 Å/16 Å) produces a low ratio of (111) to (100) peak intensity equal to 0.01, a very strong cubic texture. Multilayers of copper and $Cr_3C_2$ with a total thickness of about 1.0 µm (10,000 Å) were also tested. Multilayers having different combinations of numbers of layers and layer thicknesses were made, which showed (111)/(100) intensity ratios ranging from 1/12 (cubic) to 10/1 (111) to 1/1.5 (weak cubic). Multilayers were formed in which the carbide layers clearly cube the copper texture. The essential feature of the carbide layer(s) is that the layer(s) be thick enough (i.e., greater than 10 Å, and typically less than 500 Å, or even 200 Å) so as to form crystals that promote cubic microstructure in the copper. The thickness of the copper layers is typically less than 1000 Å. In multilayer films, the number of layers is also a consideration; too few layers may generate a weakly cubic texture.

To deposit 1.0 µm copper with strong cubic texture, several depositions were performed using different combinations of multilayer undercoats and copper layer thicknesses. The copper films were fabricated both by depositing many thin layers of copper and by using one 10,000 Å layer of copper with different underlayers. Generally, the texture of the single layer copper film followed the texture of the underlayer, and often increased the texture of the substrate. Thus, cubic textured copper is generated by a cubic underlayer, and not generated from a single carbide underlayer that is amorphous.

The degree of texture obtained in a copper layer or $Cu/Cr_3C_2$ multilayer varies with thicknesses and numbers of individual layers of copper and metal carbide, and may vary with other processing conditions such as deposition rate and deposition environment. A terminating layer of copper on a Cu/carbide multilayer will generally maintain the texture of the underlying multilayer.

The effectiveness of $Cr_3C_2$ barrier layers on silicon substrates was tested by annealing (e.g., 20 minutes at 500° C). Two definitive results were obtained. First, when copper is in direct contact with silicon, all copper is lost into the wafer. No copper peaks could be obtained after annealing, even for films that initially had a full 1.0 µm of copper as deposited. Second, when $Cr_3C_2$ is in direct contact with the silicon, the copper layers above it do not disappear by diffusing into the silicon. Even 50 Å of $Cr_3C_2$ is enough of a barrier layer to prevent large scale diffusion of copper into silicon.

Electrical resistivities of the $Cu/Cr_3C_2$ composite structure were measured using a four point testing rig. The electrical resistivity of the multilayer is 2.95 µΩ-cm as deposited, 2.67 µΩ-cm after heating to 400° C., and 2.29 µΩ-cm after heating to 725° C. The $Cr_3C_2$ itself has a resistivity of 130–140 µΩ-cm. These results suggest that the density of crystalline defects is being reduced, which in turn lowers the resistivity of the film.

Thus, metal carbides having a cubic crystal structure can be used as an effective barrier layer for copper metallizations on silicon or dielectric substrates. The foregoing description of preferred embodiments of the invention is presented for purposes of illustration and description and is not intended to be exhaustive or to limit the invention to the precise form disclosed. Many modifications and variations are possible in light of the above teaching. The scope of the invention is to be defined by the following claims.

What is claimed is:

1. A semiconductor device having copper metallizations isolated from a substrate consisting essentially of:

a substrate; and a barrier layer system, deposited on the substrate, having a cubic or metastable cubic crystal texture and comprising a plurality of alternating layers of a refractory metal carbide and copper, the layers of refractory metal carbide having a thickness that promotes cubic crystal texture in the copper layers, and a top copper layer deposited on the barrier layer system, the thickness of the top copper layer being greater than an underlying copper layer.

2. The semiconductor device as recited in claim 1, wherein the refractory metal carbide is selected from vanadium carbide (VC), niobium carbide (NbC), tantalum carbide (TaC), chromium carbide ($Cr_3C_2$), tungsten carbide (WC), and molybdenum carbide (MoC).

3. The semiconductor device as recited in claim 1, wherein the barrier layer system has a thickness less than about one micrometer.

4. The semiconductor device as recited in claim 1, further comprising a copper layer deposited on the barrier layer system.

5. The semiconductor device as recited in claim 1, wherein each copper layer has a cubic crystal texture.

6. The semiconductor device as recited in claim 1, wherein each layer of the refractory metal carbide has a thickness less than about 500 Å.

7. The semiconductor device as recited in claim 1, wherein each layer of the refractory metal carbide has a thickness of less than about 200 Å.

8. The semiconductor device as recited in claim 1, wherein each layer of the copper has a thickness of less than about 1000 Å.

9. The semiconductor device as recited in claim 1, wherein the layers of the refractory metal carbide have a thickness less than the thickness of the layers of copper.

10. The semiconductor device of claim 1, wherein the layers of refractory metal carbide are selected from the group consisting of materials having a cubic structure at equilibrium and metastable cubic structure formed under non-equilibrium conditions.

11. The semiconductor device of claim 1, wherein the layers of refractory metal carbide are selected from the group consisting of chromium carbide, vanadium carbide, niobium carbide, tantalum carbide, tungsten carbide, and molybdenum carbide.

* * * * *